(12) United States Patent
Roy

(10) Patent No.: US 6,867,989 B1
(45) Date of Patent: Mar. 15, 2005

(54) AUTO READ CONTENT ADDRESSABLE MEMORY CELL AND ARRAY

(75) Inventor: Rupesh Roy, Santa Clara, CA (US)

(73) Assignee: NetLogic Microsystems, Inc., Mountain View, CA (US)

(*) Notice: Subject to any disclaimer, the term of this patent is extended or adjusted under 35 U.S.C. 154(b) by 32 days.

(21) Appl. No.: 10/207,306

(22) Filed: Jul. 29, 2002

(51) Int. Cl.[7] .............................................. G11C 15/00
(52) U.S. Cl. ..................................... 365/49; 365/189.07
(58) Field of Search .............................. 365/49, 189.07, 365/189.08, 154, 156; 711/108, 154

(56) References Cited

U.S. PATENT DOCUMENTS

| | | | | |
|---|---|---|---|---|
| 5,388,066 A | * | 2/1995 | Hamamoto et al. | ........... 365/49 |
| 5,905,680 A | * | 5/1999 | Bosshart | ................ 365/189.07 |
| 6,108,227 A | | 8/2000 | Voelkel | ........................ 365/49 |
| 6,175,514 B1 | * | 1/2001 | Henderson et al. | ........... 365/49 |
| 6,222,752 B1 | * | 4/2001 | Kumar et al. | .................. 365/49 |
| 6,362,993 B1 | * | 3/2002 | Henderson et al. | ........... 365/49 |
| 6,512,685 B1 | * | 1/2003 | Lien et al. | ..................... 365/49 |
| 6,574,702 B2 | * | 6/2003 | Khanna et al. | .............. 711/108 |

* cited by examiner

*Primary Examiner*—Gene N. Auduong
(74) *Attorney, Agent, or Firm*—William L Paradice, III

(57) ABSTRACT

A content addressable memory (CAM) cell including a memory cell coupled to a word line, a compare circuit coupled to the memory cell and to a match line, and a driver circuit having an input coupled to the match line and an output coupled to the word line.

39 Claims, 13 Drawing Sheets

US 6,867,989 B1

AUTO READ CONTENT ADDRESSABLE MEMORY CELL AND ARRAY

FIELD OF INVENTION

This invention relates generally to content addressable memory devices and specifically to reading data from a content addressable memory device.

BACKGROUND

A content addressable memory (CAM) device is a storage device having an array of memory cells that can be instructed to compare the specific pattern of a comparand word with data words stored in corresponding rows of the array. During a compare operation, a comparand word is provided to the CAM array and compared with all the CAM words. For each CAM word that matches the comparand word, a corresponding match line is asserted to indicate the match result. If any of the match lines are asserted, a match flag is asserted to indicate the match condition, and a priority encoder determines the match address or index of the highest priority entry in the CAM array. The address may be used to access associative data stored in an associated memory such as, for example, random access memory (RAM).

It may be desirable to read the matching data resulting from the compare operation from the CAM array. Typically, the match address generated by the priority encoder is provided back to the CAM array as a read address during a subsequent read operation to retrieve the matching data from the CAM array. However, using a separate read operation to retrieve matching data from a CAM device requires additional clock cycles, and therefore may undesirably degrade performance of the CAM device. Thus, it would be desirable for a CAM device to more quickly output matching data resulting from a compare operation.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

A method and apparatus for automatically reading matching data from a CAM array during a compare operation is disclosed. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Signals preceded by "/" are active low signals. Further, logic states of various signals described herein are exemplary and therefore may be reversed or otherwise modified as generally known in the art.

The embodiments for automatically reading matching data from a CAM array during a compare operation obviate the need to provide a match address back to the CAM array during a separate read operation to retrieve the matching data. As a result, present embodiments are able to read matching data from the CAM array more quickly than prior art devices that use a match address during a separate read operation to output the matching data.

In addition, the presence of matching data read from the CAM array during the compare operation may be used to assert a match flag indicative of the match condition. For example, in accordance with one embodiment of the present invention, match logic may be configured to monitor the columns of the CAM array for the presence of matching data during the compare operation. For some embodiments, the match logic is coupled to the bit lines of the CAM array. For other embodiments, the match logic is coupled to a data bus of the CAM device. Because CAM arrays typically include a far greater number of rows than columns, match logic configurations of present embodiments that monitor columns of the CAM array for match conditions combine relatively few input signals to generate the match flag, as compared with conventional match logic configurations that monitor rows of the CAM array to detect match conditions. Accordingly, match logic configurations of present embodiments may be smaller, faster, and consume less power than conventional match logic configurations.

Figure 1:
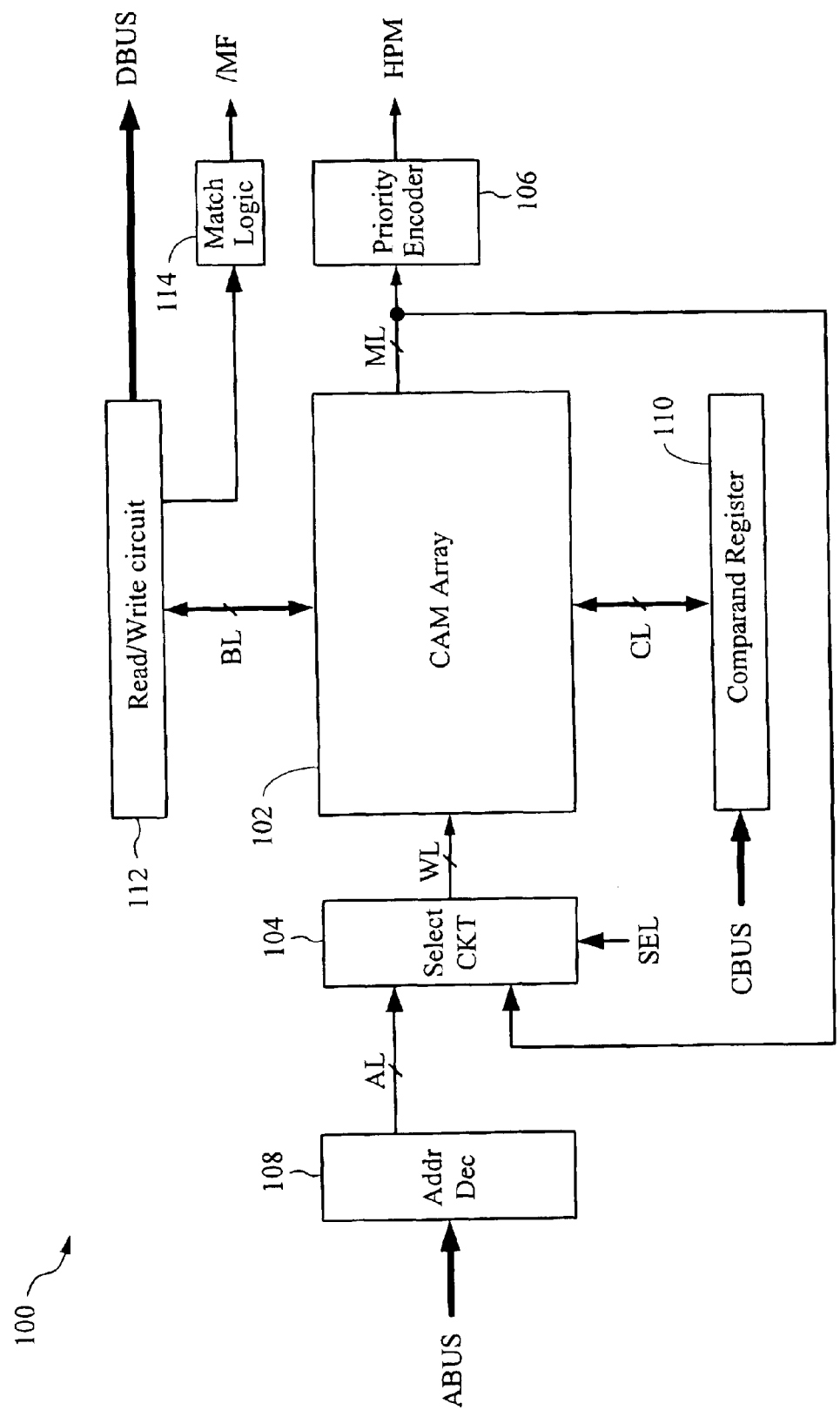
FIG. 1 is a block diagram of one embodiment of a CAM device in accordance with the present invention.

FIG. 1 shows one embodiment of a CAM device 100 in accordance with the present invention. CAM device 100 includes a CAM array 102 that has a plurality of CAM cells (not shown in FIG. 1 for simplicity) arranged in any number of rows and columns. The CAM cells in array 102 may be any suitable type of CAM cell. One or more instructions and related control signals may be provided to CAM device 100 from an instruction decoder (not shown for simplicity) to control read, write, and compare operations for CAM device 100. Other well-known signals which may be provided to CAM device 100, such as enable signals, reset signals, and clock signals, are not shown for simplicity.

Each row of CAM cells in array 102 is coupled to a select circuit 104 via a corresponding word line WL, and to a priority encoder 106 via a corresponding match line ML. For simplicity, the word lines WL and match lines ML are represented collectively in FIG. 1. The match lines ML provide match results for compare operations to priority encoder 106, which determines the matching entry that has the highest priority number associated with it and generates the index or address of this highest priority match (HPM). If there are multiple matching entries, priority encoder 106 determines the HPM address based on which matching entry is stored in the lowest numerical address of array 102. For alternative embodiments, priority encoder 106 may determine the HPM address based on entries stored in array 102 in other predetermined arrangements. (e.g., at the highest numerical address).

Each match line ML is also coupled to the word line WL for the corresponding row via select circuit 104, which also includes inputs to receive a decoded address from an address decoder 108 via address lines AL. For one embodiment, address decoder 108 receives addresses from an address bus ABUS. For other embodiments, address decoder 108 receives addresses from another bus. Select circuit 104 also includes an input to receive a select signal SEL indicative of whether CAM device 100 is performing a read/write operation or a compare operation. When SEL is in a first state (e.g., SEL=0) to indicate a read/write operation, select circuit 104 may assert a word line WL for a corresponding row of CAM cells in array 102 in response to a decoded address received from address decoder 108. Data may then be written to or read from the selected row of array 102 in any well-known manner. Conversely, when SEL is in a second state (e.g., SEL=1) to indicate a compare operation, select circuit 104 may assert a word line WL for a corresponding row of array 102 in response to match signals provided on match lines ML. In this manner, matching data resulting from the compare operation may be quickly read from CAM array 102 without generating the match address and/or providing the match address to address decoder 108.

Further, although not shown in FIG. 1 for simplicity, each row of CAM cells in CAM array 102 may have one or more validity bits to indicate whether the corresponding row (or segment thereof) of CAM cells is in a valid state or an empty state. The validity bits may be provided to priority encoder 106 to generate the next free address (NFA) that is available in CAM array 102 for storing new data. The validity bits may also be provided to a well-known full flag logic circuit (not shown for simplicity) to generate a full flag and/or empty flag for CAM array 102.

Each column of CAM cells in array 102 is coupled to a comparand register 110 via comparand lines CL and to a read/write circuit 112 via bit lines BL. Comparand register 110 provides a comparand word (e.g., search key) received from a comparand bus CBUS to CAM array 102 for comparison with entries stored in CAM array 102. For other embodiments, comparand words may be provided to comparand register 110 from another bus. Read/write circuit 112 includes well-known write drivers and sense amplifiers, and is coupled to a data bus DBUS. Although not shown for simplicity, CAM device 100 may also include a global mask circuit that stores one or more mask patterns that mask entries in CAM array 102 during compare operations with the comparand word provided by comparand register 110.

Match logic 114 detects the presence of matching data read from data lines of CAM array 102 during compare operations. If matching data is detected on the data lines, match logic 114 asserts a match flag /MF to indicate the match condition. The match flag /MF may be output on a dedicated signal line, on DBUS, or on another bus. For simplicity, match logic 114 is shown in FIG. 1 as coupled to read/write circuit 112, which in turn is coupled to bit lines BL and to DBUS. For one embodiment, match logic 114 is coupled to bit lines BL of CAM array 102. For another embodiment, match logic 114 is coupled to DBUS. For other embodiments, match logic 114 may be coupled to sense amplifiers, buffers, or drivers of read/write circuit 112.

Figure 2:
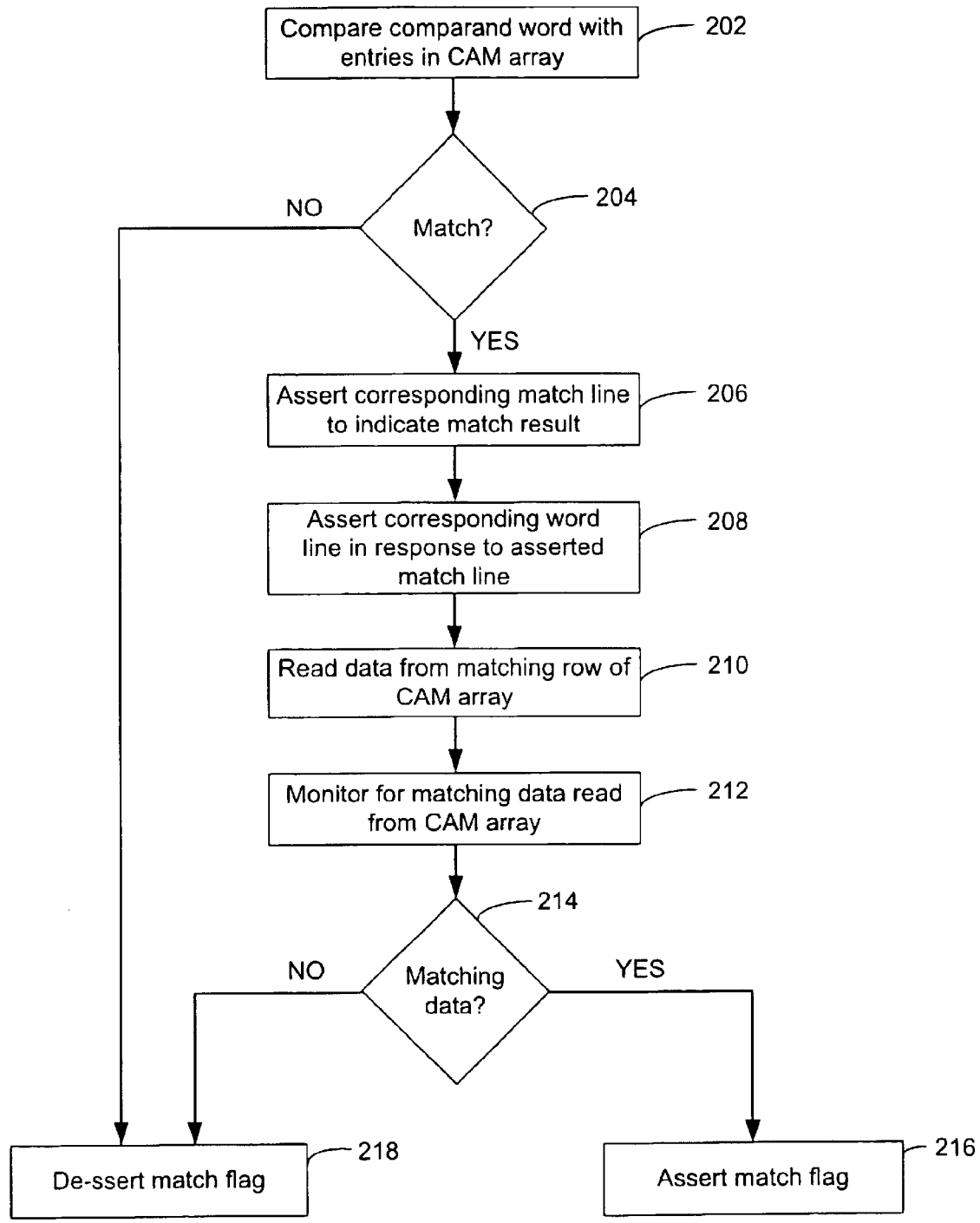
FIG. 2 is a flow chart illustrating one embodiment of a compare operation for the CAM device of FIG. 1.

Operation of CAM device 100 in automatically reading matching data from the array during a compare operation is described below with respect to the flow chart of FIG. 2. During a compare operation, SEL is driven to the second state (e.g., SEL=1), and a comparand word is provided to and compared with entries stored in rows of CAM cells of CAM array 102 (202). If a row has a matching entry (204), the match line ML for the row is asserted to indicate the match result (206). In response to the asserted match line, select circuit 104 asserts the word line WL for the matching row (208). The asserted word line, in turn, causes data from the matching row to be read from CAM array 102 via bit lines BL to read/write circuit 112, which in turn outputs the matching data onto DBUS (210). In this manner, matching data is quickly read from CAM array 102 during the compare operation without using priority encoder 106 and address decoder 108 during a separate read operation to access the matching data.

Match logic 114 monitors columns of CAM array 102 via the data lines (e.g., bit lines BL, DBUS, and/or read/write circuit 112) for matching data read from CAM array 102 during the compare operation (212) to detect a match condition. If matching data is detected on the data lines (214), match logic 114 asserts match flag /MF to indicate the match condition (216). Otherwise, match logic 114 de-asserts match flag /MF to indicate the mismatch condition (218). Because the relative size and complexity of match logic 114 is determined by the number of columns in CAM array 102, rather than by the number of rows, and because CAM array 102 typically includes far more rows than columns, match logic 114 is relatively small and fast, as compared to conventional row-based match logic configurations. Nevertheless, if desired, conventional row-based match logic configurations may be used with CAM device 100 by appropriate connections to match lines ML.

Figure 3:
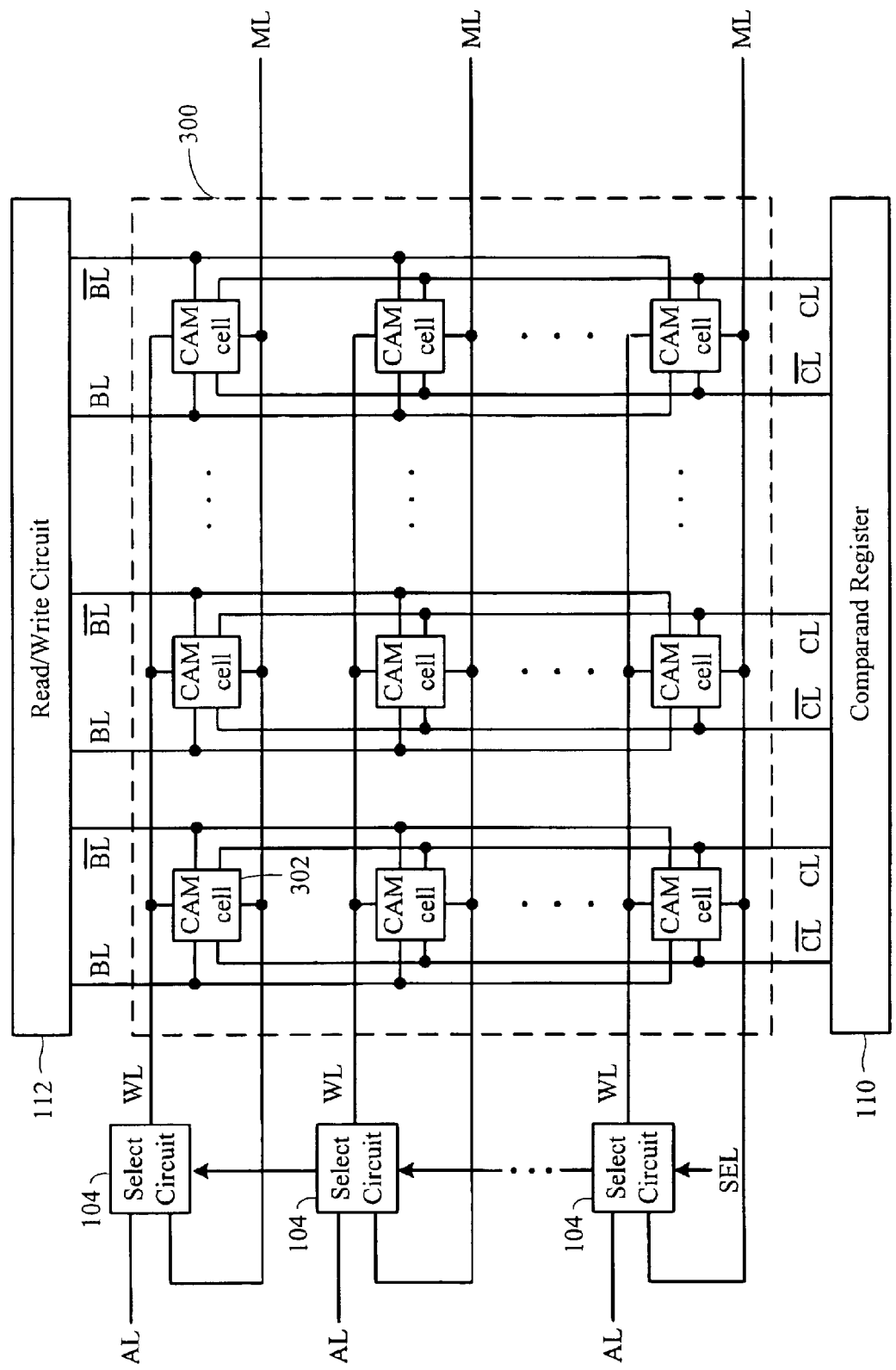
FIG. 3 is a block diagram of one embodiment of the CAM array of FIG. 1.

FIG. 3 shows a CAM array 300 that is one embodiment of CAM array 102 of FIG. 1. CAM array 300 includes a plurality of CAM cells 302 organized in any number of rows and columns. CAM cells 302 are well-known, and may be any suitable binary cell implemented using Static Random Access Memory (SRAM), Dynamic RAM (DRAM), or non-volatile memory. As noted above, one or more validity bits (not shown) may also be included. Each row of CAM cells 302 is coupled to a match line ML and to a word line WL.

Each word line WL is driven by a corresponding select circuit 104 to select a row of CAM cells 302 for writing or reading. Each select circuit 104 receives the select signal SEL. For one embodiment, each select circuit 104 drives its word line WL to logic high to select the corresponding row of CAM cells 302 if (1) the corresponding address line AL is asserted to logic high by address decoder 108 during a read or write operation and SEL=0 or (2) if the corresponding match line ML indicates a match condition during a compare operation and SEL=1.

A match line ML is asserted to indicate a match condition for the row only if all CAM cells 302 in that row match the comparand data. In some embodiments, the match line ML is pre-charged for the compare operation. For one embodiment, if any CAM cell 302 in the row does not match the comparand data, the CAM cell(s) 302 discharge the match line ML toward ground potential (i.e., logic low) to indicate a mismatch, and if all CAM cells 302 match the comparand data, the match line ML remains in a charged (i.e., logic high) state to indicate a match. For other embodiments, a logic high match signal on ML may indicate the mismatch condition and a logic low match signal on ML may indicate the match condition.

Each column of CAM cells 302 is coupled to a bit line pair BL and $\overline{BL}$ and to a comparand line pair CL and $\overline{CL}$. The bit line pairs BL and $\overline{BL}$ are each coupled to read/write circuit 112. Read/write circuit 112 is well-known, and may include write drivers or buffers to provide data to bit line pairs BL and $\overline{BL}$ during write operations, and may include sense amplifiers to determine the logic states of bit line pairs BL and $\overline{BL}$ during read and compare operations. For one embodiment, bit line pairs BL and $\overline{BL}$ are pre-charged (e.g., to logic high) prior to compare operations. The comparand line pairs CL and $\overline{CL}$ are each coupled to comparand register 110, which includes drivers to provide comparand data to CAM cells 302 via comparand lines CL and $\overline{CL}$ during compare operations.

For alternate embodiments, other CAM array architectures may be used. For example, in some embodiments, CAM array 300 may not include complementary comparand lines CL and $\overline{CL}$, in which case the complementary bit lines BL and $\overline{BL}$ may be coupled to comparand register 110 and used to perform a compare operation as is generally known in the art. Further, for some embodiments, DBUS and CBUS may be the same bus. Additionally, although CAM array 300 is shown as a NOR-based CAM array, in alternative embodiments other CAM arrays (e.g., NAND-based CAM arrays) may be used.

Read, write, and compare operations are more fully described below with reference to FIGS. 1 and 3. For write operations, SEL is driven to logic low, and a data word is provided to read/write circuit 112, which in turn drives the data word onto corresponding bit line pairs BL and $\overline{BL}$. The data word is written to a row of CAM array 300 selected by address decoder 108 via select circuits 104 in response to a write address, which may be an externally provided address, the NFA generated by priority encoder 106, or any other presented address. For one embodiment, address decoder 108 decodes the write address and asserts (e.g., to logic high) one of address lines AL accordingly. The select circuit 104 coupled to the asserted address line AL asserts (e.g., to logic high) its corresponding word line WL to select the addressed row for the write operation. All other select circuits 104 de-assert (e.g., to logic low) their corresponding word lines for the write operation. During write operations, match logic 114 may be disabled from asserting the match flag /MF in response to data present on bit lines BL and $\overline{BL}$. For one example, a disable signal (not shown) may be provided to prevent match logic 114 from asserting match flag /MF during write operations.

For read operations, SEL is driven to logic low, and select circuits 104 assert the word line WL corresponding to the row selected by address decoder 108, as indicated by address lines AL. Data stored in CAM cells 302 of the selected row is provided onto bit line pairs BL and $\overline{BL}$ to read/write circuit 112, which in turn output the data to DBUS. During such read operations, match logic 114 may be disabled from asserting the match flag /MF in response to data present on bit lines BL and $\overline{BL}$.

For compare operations, address lines AL are initially set to logic low. Match lines ML and bit line pairs BL and $\overline{BL}$ are pre-charged to logic high by suitable pre-charge circuits (not shown for simplicity). SEL is initially set to logic low, which prevents select circuits 104 from driving word lines WL to logic high in response to the pre-charged match lines ML. A comparand word is provided to comparand register 110 via CBUS, which in turn forwards the comparand word onto the comparand line pairs CL and $\overline{CL}$ to allow for comparison with data bits stored in corresponding columns of the CAM array.

Then, the comparand word is compared with data stored in rows of CAM array 300 to generate match results on match lines ML. Once the match signals on match lines ML settle (e.g., are valid), SEL is asserted to logic high, which in turn allows select circuits 104 to drive word lines WL in response to the match signals on match lines ML. If a row has a match, the match line ML remains in its charged state. In response to the asserted match signal, select circuit 104 drives word line WL for the row to logic high, which in turn causes the matching data to be read from the row to read/write circuit 112 via bit line pairs BL and $\overline{BL}$. Read/write circuit 112 may output the matching data onto DBUS. Match logic 114 detects the matching data provided on the data lines, and asserts match flag /MF to indicate the match condition.

Conversely, if a row does not have matching data, its match line ML is discharged to logic low, select circuit 104 does not assert the word line WL for the row, and data is not read from the row. Because matching data is not present on the data lines (e.g., bit lines), match logic 114 de-asserts /MF to indicate the mismatch condition.

Figure 4:
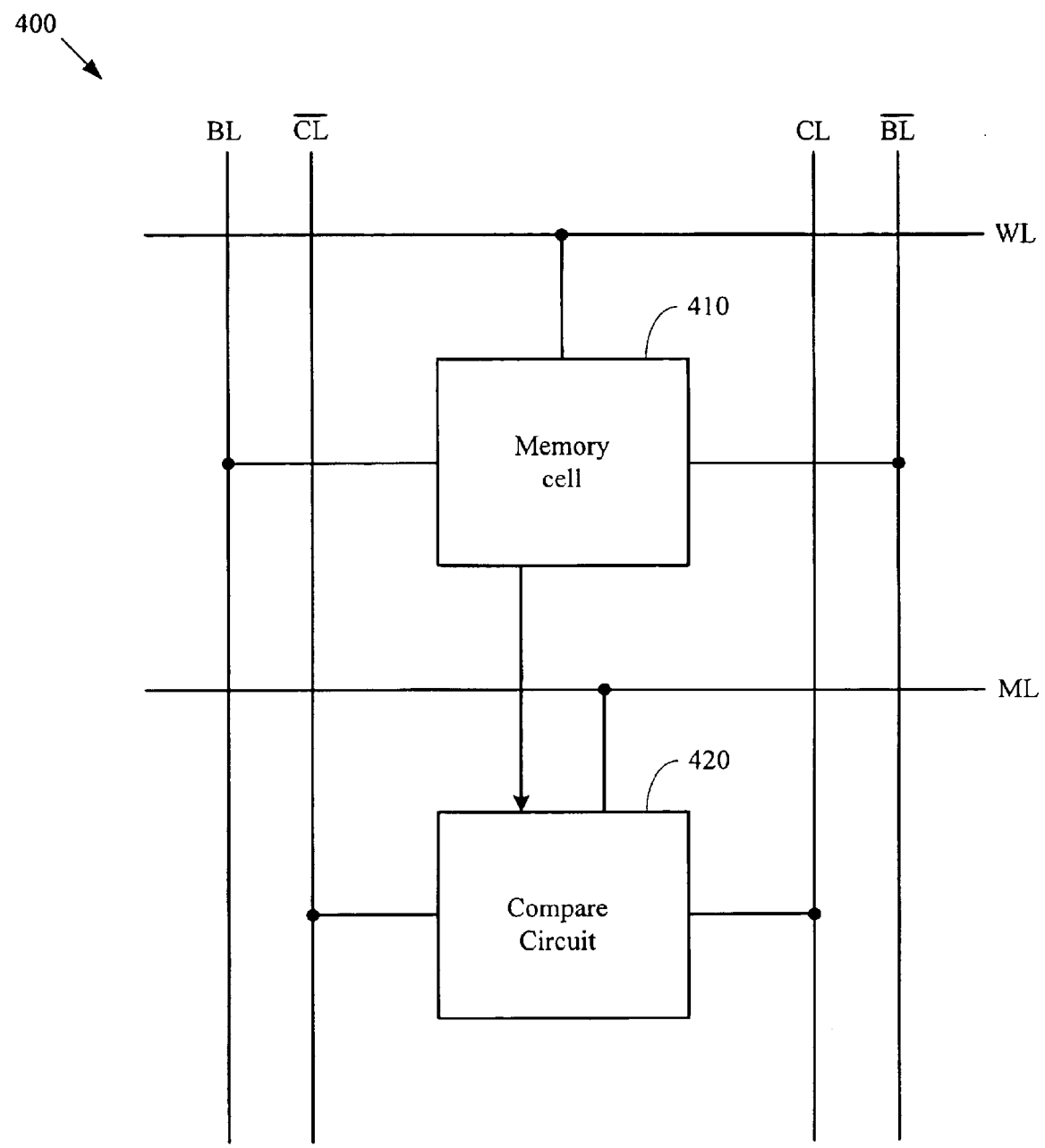
FIG. 4 is a block diagram of one embodiment of the CAM cells of FIG. 3.

FIG. 4 shows a CAM cell 400 that is one embodiment of CAM cell 302. CAM cell 400 includes a memory cell 410 and a compare circuit 420. Memory cell 410, which may be any memory circuit for storing at least one bit of data, is coupled to bit line pair BL and $\overline{BL}$ and to word line WL. When memory cell 410 is selected by word line WL, data may be read from memory cell 410 onto bit line pair BL and $\overline{BL}$. Compare circuit 420 is coupled to memory cell 410, to comparand lines CL and $\overline{CL}$, and to match line ML. Compare circuit 420 may compare comparand data supplied from comparand register 110 via CL and $\overline{CL}$ with data stored in memory cell 410, and output the match result on match line ML. Compare circuit 420 may be any well-known compare circuit, and may include an exclusive-OR (XOR) gate or an exclusive-NOR (XNOR) gate. It will be appreciated that other types of CAM cells may be used for CAM cells 302.

Figure 5:
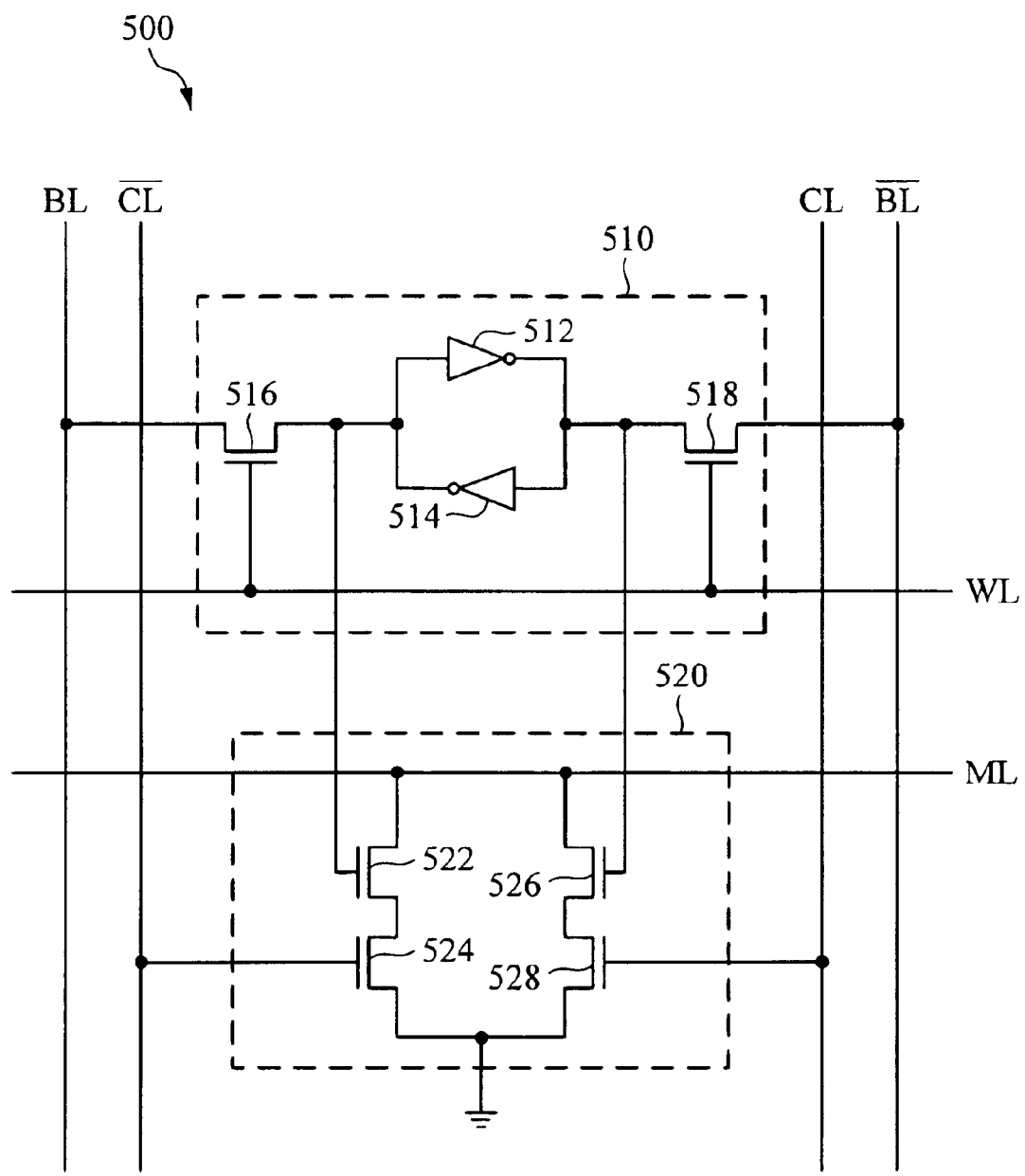
FIG. 5 is a circuit diagram of one embodiment of the CAM cell of FIG. 4.

FIG. 5 shows a CAM cell 500 that is one embodiment of CAM cell 400 of FIG. 4. CAM cell 500 includes a memory cell 510 for storing a data bit D and a compare circuit 520 for comparing the data bit with a comparand bit C. Memory cell 510 includes a RAM cell formed by cross-coupled inverters 512 and 514, and includes pass transistors 516 and 518. Pass transistor 516 is coupled between the RAM cell and bit line BL, and has a gate coupled to word line WL. Pass transistor 518 is coupled between the RAM cell and complementary bit line $\overline{BL}$, and has a gate coupled to word line WL.

Compare circuit 520 includes transistors 522, 524, 526, and 528. Transistors 522 and 524 are coupled in series between match line ML and ground potential, with the gate of transistor 522 coupled to memory cell 510 to receive the data bit D and the gate of transistor 524 coupled to complementary comparand line $\overline{CL}$ to receive the complement $\overline{C}$ of the comparand bit. Transistors 526 and 528 are coupled in series between match line ML and ground potential, with the gate of transistor 526 coupled to memory cell 510 to receive the complement $\overline{D}$ of the data bit and the gate of transistor 528 coupled to comparand line CL to receive the comparand bit C. For other embodiments, other well-known compare circuits may be used for compare circuit 520.

For the embodiment shown in FIG. 5, CAM cell 500 discharges ML to logic low if there is not a match, and does not discharge ML if there is a match. Thus, a logic high signal on match line ML indicates a match for the row, and a logic low signal on match line ML indicates a mismatch for the row. For other embodiments, CL and $\overline{CL}$ may be reversed (e.g., the gate of transistor 524 is coupled to CL and the gate of transistor 528 is coupled to $\overline{CL}$) such that the CAM cell discharges ML to logic low if there is a match and does not discharge ML if there is not a match. For these other embodiments, the match signals may be logically inverted before being provided to select circuit 104.

Figure 6A:
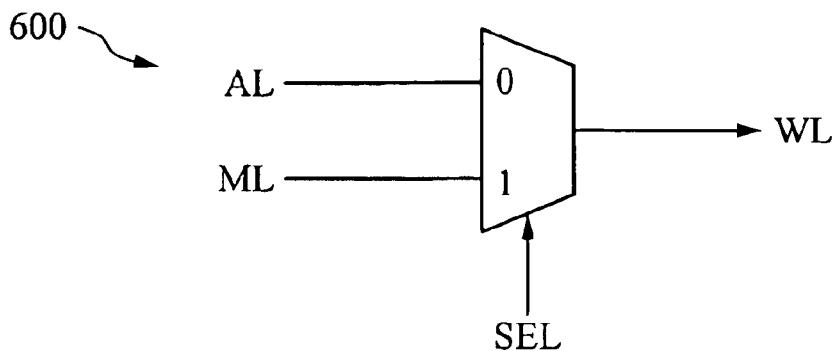
FIGS. 6A–6C are logic diagrams of select circuits for the CAM array of FIG. 3.

FIG. 6A shows a select circuit 600 that is one embodiment of select circuit 104 that may be used with CAM array 300 of FIG. 3. Select circuit 600 includes a multiplexer (MUX) having a first input coupled to corresponding address line AL, a second input coupled to corresponding match line ML, an output coupled to corresponding word line WL, and a select terminal to receive SEL. In operation, select circuit 600 asserts word line WL if (1) the address line AL is asserted to logic high by address decoder 108 when SEL=0 during a read or write operation or (2) the match line ML is asserted to logic high to indicate a match when SEL=1 during a compare operation.

Figure 6B:
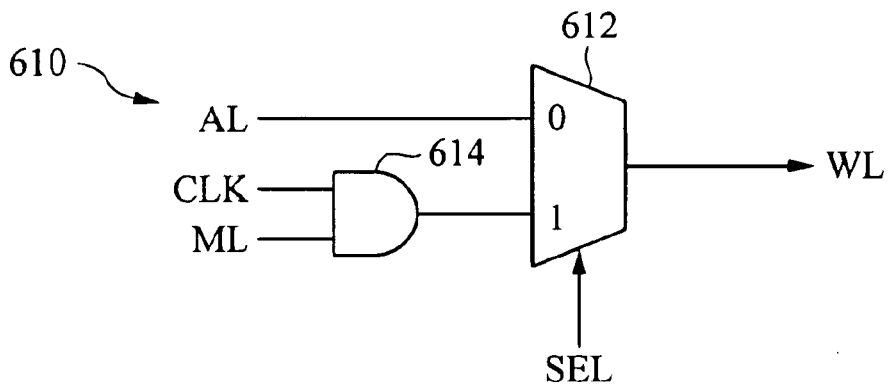

FIG. 6B shows a select circuit 610 that is another embodiment of select circuit 104 that may be used with CAM array 300 of FIG. 3. Select circuit 610 includes a MUX 612 and an AND gate 614. AND gate 614 includes a first input to receive a clock signal CLK, a second input coupled to corresponding match line ML, and an output. MUX 612 includes a first input to coupled to corresponding address line AL, a second input coupled to the output of AND gate 614, an output coupled to corresponding word line WL, and a select terminal to receive SEL. For embodiments using select circuit 610 of FIG. 6B, CLK is in a logic low state (CLK=0) during the pre-charge phase of the compare operation, and transitions to a logic high state (CLK=1) during the evaluation phase of the compare operation. The logic low state of CLK prevents a pre-charged match line ML from driving word line WL to logic high via MUX 612 before the match results have settled on ML. When CLK transitions to logic high for the evaluation phase of the compare operation, the match results on ML may drive word line WL via MUX 612. Thus, for such embodiments, SEL may be asserted to logic high at the beginning of the compare operation instead of after the match signals on match lines ML have settled.

In operation, select circuit 610 asserts word line WL if (1) the address line AL is asserted to logic high by address decoder 108 during a read or write operation (SEL=0) or (2) the match line ML is asserted to logic high to indicate a match during the evaluation phase (CLK=1) of a compare operation (SEL=1).

Figure 6C:
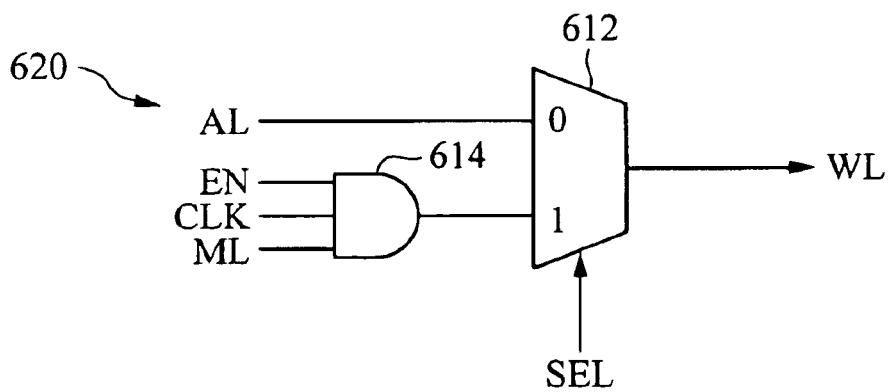

FIG. 6C shows a select circuit 620 that is another embodiment of select circuit 104 that may be used with CAM array 300 of FIG. 3. Select circuit 620 is similar to select circuit 610 of FIG. 6B, except that AND gate 612 includes a third input to receive an enable signal EN. When EN is not asserted (e.g., EN=0), the output of AND gate 614 is forced to logic low. When EN is asserted (e.g., EN=1), the output SEL of AND gate 614 may be driven to logic high during the evaluation phase of the compare operation (CLK=1) if the match signal on ML indicates a match (ML=1). For one embodiment, EN is asserted after the match signal on match line ML has settled. For another embodiment, EN is asserted only when valid comparand data is present on comparand lines CL and $\overline{CL}$.

As described above, match logic 114 asserts match flag /MF to indicate a match condition if matching data is read from the CAM array during a compare operation. For one embodiment, match logic 114 is a logic gate having inputs to receive data read from the CAM array and an output to provide the match flag.

Figure 7:
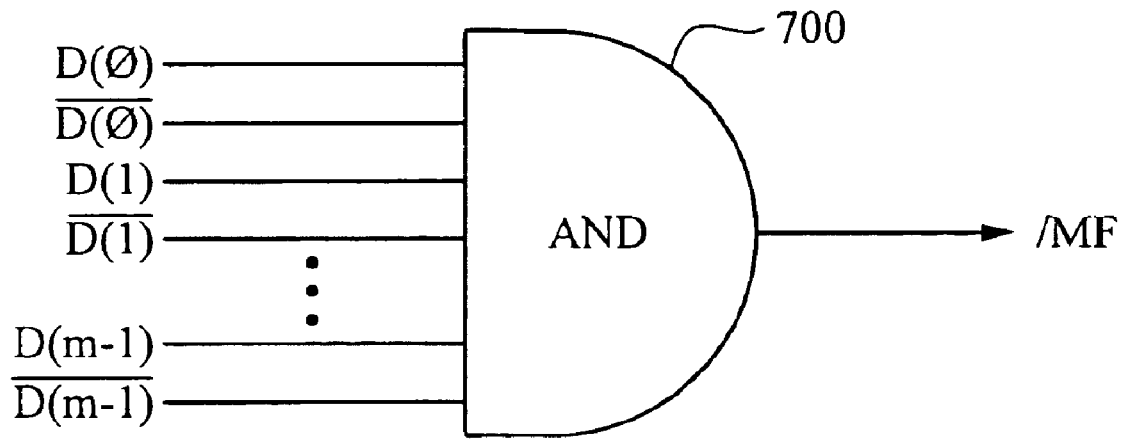
FIG. 7 is a logic diagram of one embodiment of the match logic of the CAM device of FIG. 1.

FIG. 7 shows an AND gate 700 that is one embodiment of match logic 114. AND gate 700 includes m pairs of inputs, each to receive a data bit D and its complement $\overline{D}$ from a corresponding column of the CAM array, and an output to provide match flag /MF. Each input pair of AND gate 700 may receive complementary data bits D(0)–D(m–1) and $\overline{D(0)}$–$\overline{D(m-1)}$ from a corresponding bit line pair BL and $\overline{BL}$ of the CAM array, from DBUS, or from read/write circuit 112. Prior to a compare operation, the bit line pairs BL and $\overline{BL}$ of the CAM array are pre-charged to logic high (e.g., by pre-charge circuits coupled to the bit lines), which in turn drives D and $\overline{D}$ (and thus all inputs to AND gate 700) to logic high. In response thereto, AND gate 700 de-asserts /MF to logic high, which indicates the mismatch condition. During the compare operation, if any row has matching data, the matching data is automatically read from the CAM array as complementary data D and $\overline{D}$ onto bit line pairs BL and $\overline{BL}$, respectively. In response thereto, AND gate 700 asserts /MF to the match condition.

For another embodiment, match logic 114 is a comparator having first inputs to receive the matching data read from the CAM array, second inputs to receive the comparand word, and an output to provide the match flag.

Figure 8:
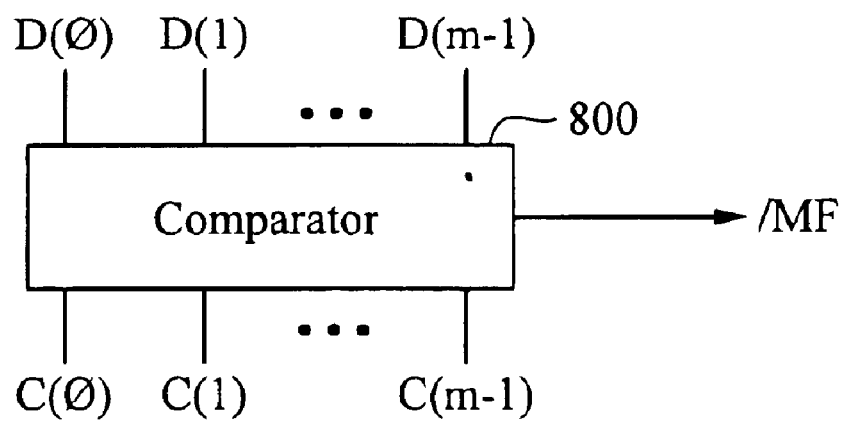
FIG. 8 is a block diagram of another embodiment of the match logic of the CAM device of FIG. 1.

FIG. 8 shows a comparator 800 that is another embodiment of match logic 114. Comparator 800 includes m first inputs, each to receive a corresponding data bit D, m second inputs, each to receive a corresponding comparand bit C, and an output to provide /MF. The first inputs of comparator 800 may receive data bits D(0)–D(m–1) from corresponding bit lines BL, from DBUS, or from read/write circuit 112. The second inputs to comparator 800 may receive comparand bits C(0)–C(m–1) from corresponding comparand lines CL, from comparand register 110, or from CBUS. If data read from the CAM array during the compare operation matches the comparand data, comparator 800 asserts /MF to indicate the match condition. Otherwise, comparator 800 de-asserts /MF to indicate the mismatch condition. For some embodiments, comparator 800 may be timed by EN or CLK such that it performs a comparison only after data on D(0)–D(m–1) and data on C(0)–C(m–1) are stable, and drives /MF to a mismatch state otherwise.

As described above, select circuit 104 allows matching data resulting from a compare operation to be quickly read from the CAM array, without using a match address during a separate read operation, by automatically asserting a row's word line in response to the row's match line. For other embodiments, each CAM cell may be modified to include drive circuitry that asserts the row's word line in response to the row's match line, and select circuit 104 may be eliminated.

Figure 9:
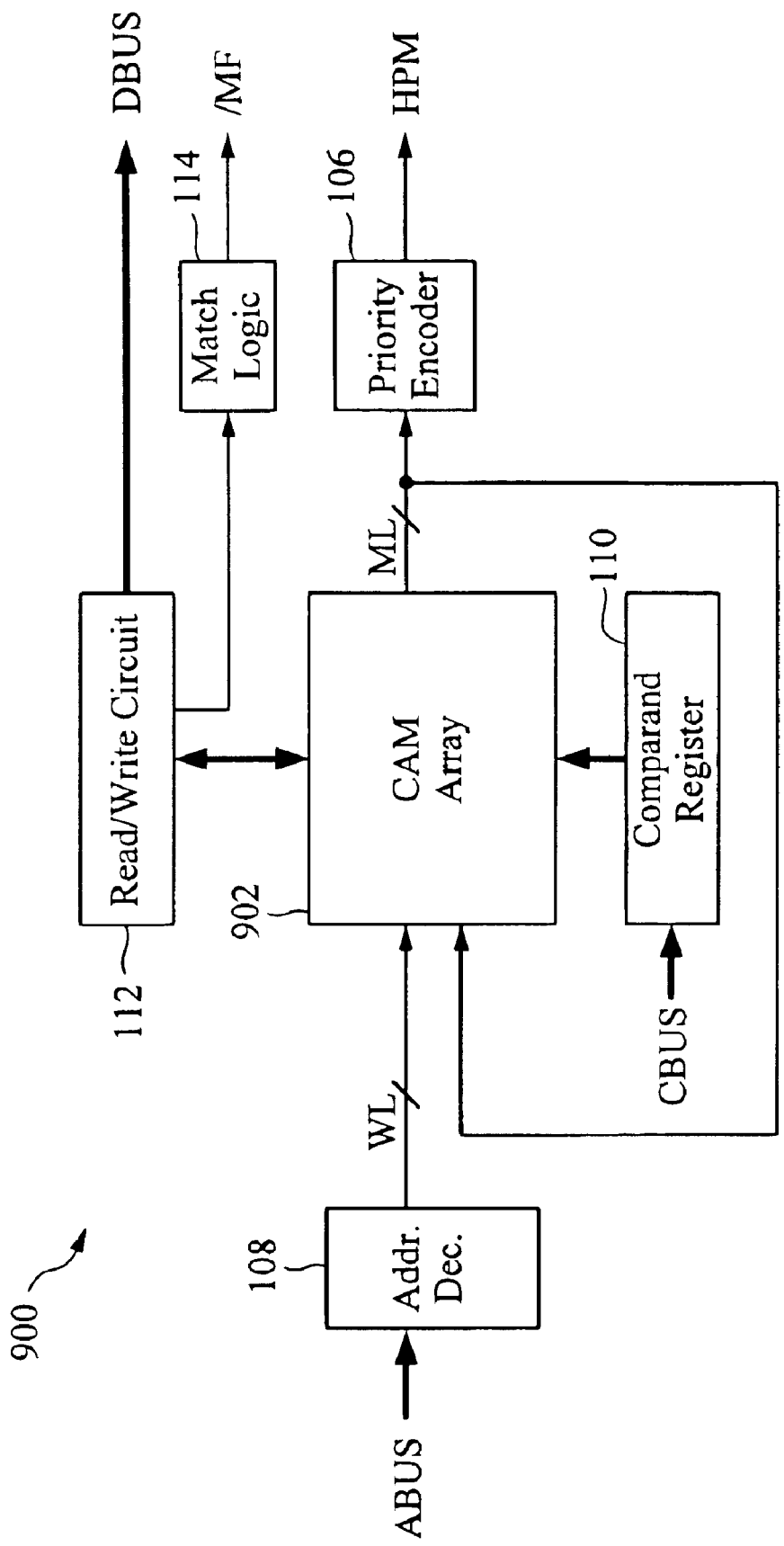
FIG. 9 is a block diagram of another embodiment of a CAM device in accordance with the present invention.

FIG. 9 shows a CAM device 900 in accordance with another embodiment of the present invention. CAM device 900 is similar to CAM device 100 of FIG. 1, except that CAM array 902 includes CAM cells (not shown in FIG. 9) modified to include drive circuitry that asserts the row's word line in response to the row's match line to automatically read matching data from the CAM cell. Select circuit 104 is eliminated, and the word lines WL of CAM array 902 are connected to address decoder 108. For one embodiment, CAM array 902 is similar to CAM array 300 of FIG. 3, except that CAM array 902 includes auto-read CAM cells described below with respect to FIGS. 10–12.

Figure 10:
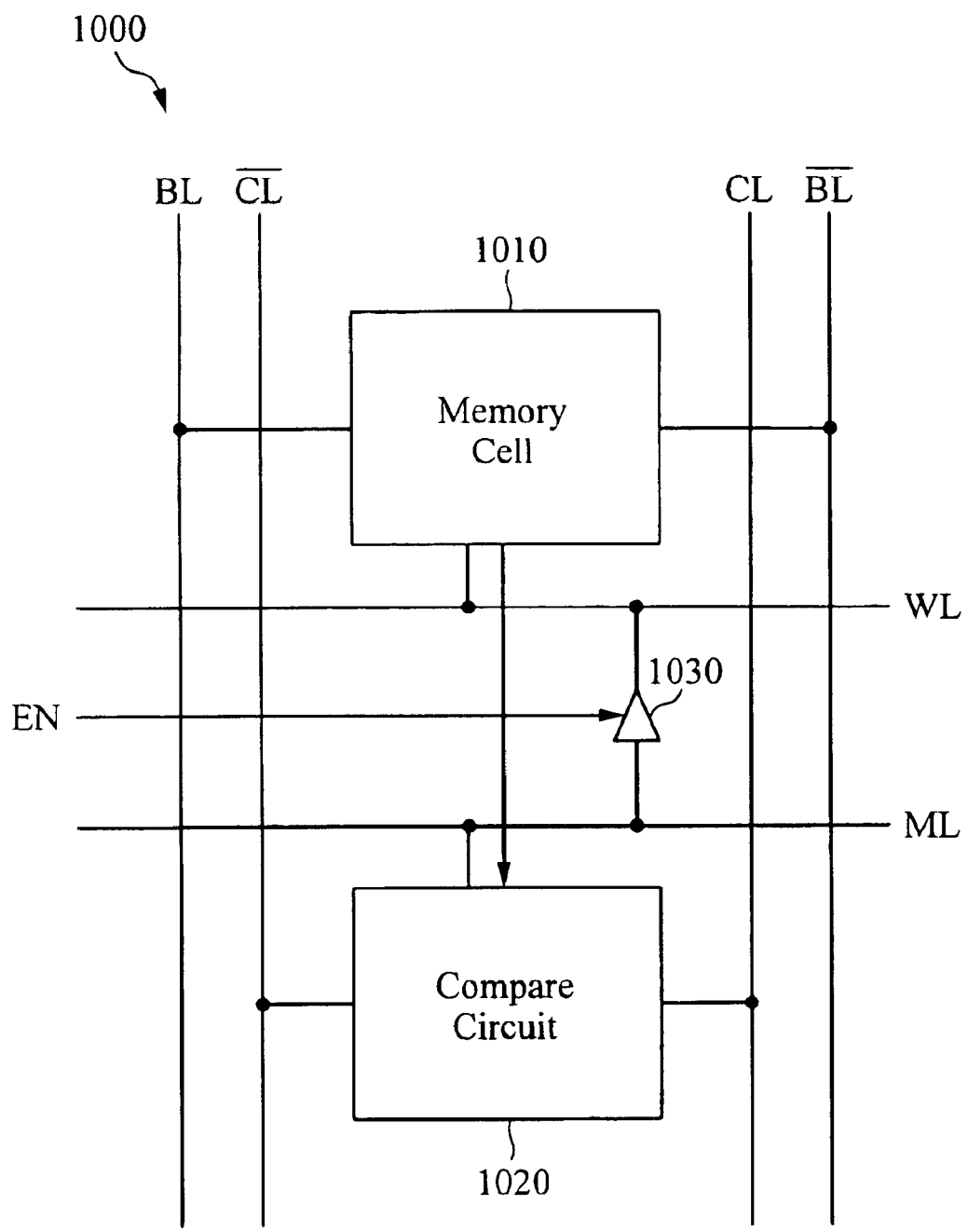
FIG. 10 is a block diagram of one embodiment of a CAM cell employed in the CAM device of FIG. 9.

FIG. 10 shows an auto-read CAM cell 1000 that is one embodiment of the CAM cells used for CAM array 902 of FIG. 9. CAM cell 1000 includes a memory cell 1010, a compare circuit 1020, and a driver circuit 1030. Memory cell 1010, which may be any memory circuit for storing at least one data bit, is coupled to bit line pair BL and $\overline{BL}$ and to word line WL. When memory cell 1010 is selected by word line WL, data may be read from memory cell 1010 onto bit line pair BL and $\overline{BL}$. Compare circuit 1020 is coupled to memory cell 1010, to comparand lines CL and $\overline{CL}$, and to match line ML. Compare circuit 1020 may compare comparand data supplied from comparand register 110 via CL and $\overline{CL}$ with data stored in memory cell 1010, and may output the match result on match line ML. Compare circuit 1020 may be any well-known compare circuit, and may include an exclusive-OR (XOR) gate or an exclusive-NOR (XNOR) gate.

Driver circuit 1030 is a tri-state driver having an input coupled to match line ML, an output coupled to word line WL, and a control terminal to receive an enable signal EN. When EN is asserted (e.g., to logic high), driver circuit 1030 is enabled and may drive word line WL in response to match signals on match line ML. When EN is de-asserted (e.g., to logic low), driver circuit 1030 is disabled from driving word line WL in response to match signals on ML. For some embodiments, EN is asserted to logic high during compare operations only after the match signals on match line ML have settled. EN may be generated in any suitable manner. For one embodiment, EN is generated by gating the select signal SEL with the clock signal CLK in an AND gate (not shown for simplicity). For another embodiment, EN is SEL.

Figure 11:
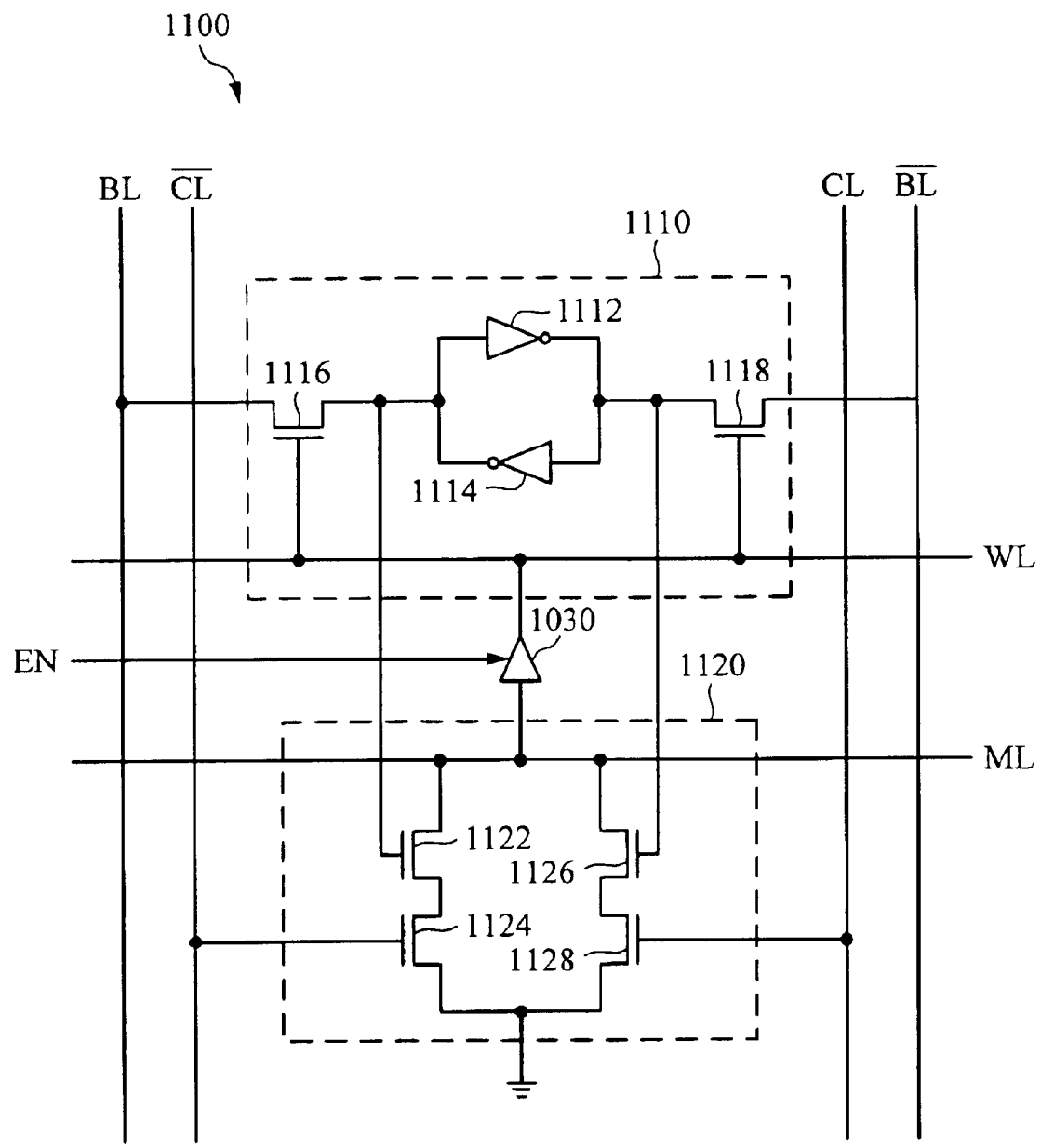
FIG. 11 is a circuit diagram of one embodiment of the CAM cell of FIG. 10.

FIG. 11 shows a CAM cell 1100 that is one embodiment of CAM cell 1000. CAM cell 1100 includes a memory cell 1110, a compare circuit 1120, and driver circuit 1030. Memory cell 1100 includes a RAM cell formed by cross-coupled inverters 1112 and 1114, and includes pass transistors 1116 and 1118. Pass transistor 1116 is coupled between the RAM cell and bit line BL, and has a gate coupled to word line WL. Pass transistor 1118 is coupled between the RAM cell and complementary bit line $\overline{BL}$, and has a gate coupled to word line WL.

Compare circuit 1120 includes transistors 1122, 1124, 1126, and 1128. Transistors 1122 and 1124 are coupled in series between match line ML and ground potential, with the gate of transistor 1122 coupled to memory cell 1110 and the gate of transistor 1124 coupled to complementary comparand line $\overline{CL}$. Transistors 1126 and 1128 are coupled in series between match line ML and ground potential, with the gate of transistor 1126 coupled to memory cell 1110 and the gate of transistor 1128 coupled to comparand line CL. For other embodiments, other well-known compare circuits may be used for compare circuit 1120.

The operation of CAM cell 1100 for a compare operation is as follows. During the pre-charge phase of the compare operation, match line ML and bit line pair BL and $\overline{BL}$ are pre-charged to logic high, for example, by suitable pre-charge circuits (not shown for simplicity). For one embodiment, the pre-charge circuits are enabled in response to a logic low CLK. EN is initially set to logic low (EN=0) to disable driver circuit 1030. A comparand bit C is provided on comparand line CL, and the complement $\overline{C}$ of the comparand bit is provided on complementary comparand line $\overline{CL}$.

During the evaluation phase of the compare operation, the pre-charge circuits for match line ML and bit line pair BL and $\overline{BL}$ are disabled, for example, in response to CLK transitioning to logic high. Comparand data is compared with data stored in CAM cell 1100 to generate match results on match line ML. Once the match signal on match line ML settles, EN is asserted to logic high to enable driver circuit 1030. If the data bit stored in memory cell 1110 matches the comparand bit, compare circuit 1120 does not discharge match line ML, which in turn remains in its logic high state. In response to the logic high ML, driver circuit 1030 drives word line WL to logic high, and data stored in memory cell 1110 is read onto bit lines BL and $\overline{BL}$. Conversely, if the data bit stored in memory cell 1110 does not match the comparand bit, compare circuit 1120 discharges match line ML to logic low. In response thereto, driver circuit 1030 does not drive WL to logic high, and data is not read from memory cell 1110.

For the embodiment shown in FIG. 11, CAM cell 1100 discharges ML to logic low if there is not a match, and does not discharge ML if there is a match. Thus, a logic high signal on match line ML indicates a match for the row, and a logic low signal on match line ML indicates a mismatch for the row. For other embodiments, CL and $\overline{CL}$ may be reversed (e.g., the gate of transistor 1124 is coupled to CL and the gate of transistor 1128 is coupled to $\overline{CL}$) such that the CAM cell discharges ML to logic low it there is a match and does not discharge ML if there is not a match. For these other embodiments, driver circuit 1030 may be an inverting driver circuit.

Because word line WL of CAM cell 1100 may be asserted by either driver circuit 1030 in response to a match signal on match line ML or by address decoder 108 in response to a presented address, there may be undesirable driver contention for word line WL. Thus, for some embodiments, an additional word line and an additional bit line pair may be provided for reading data from the CAM cell during compare operations, as illustrated in FIG. 12.

Figure 12:
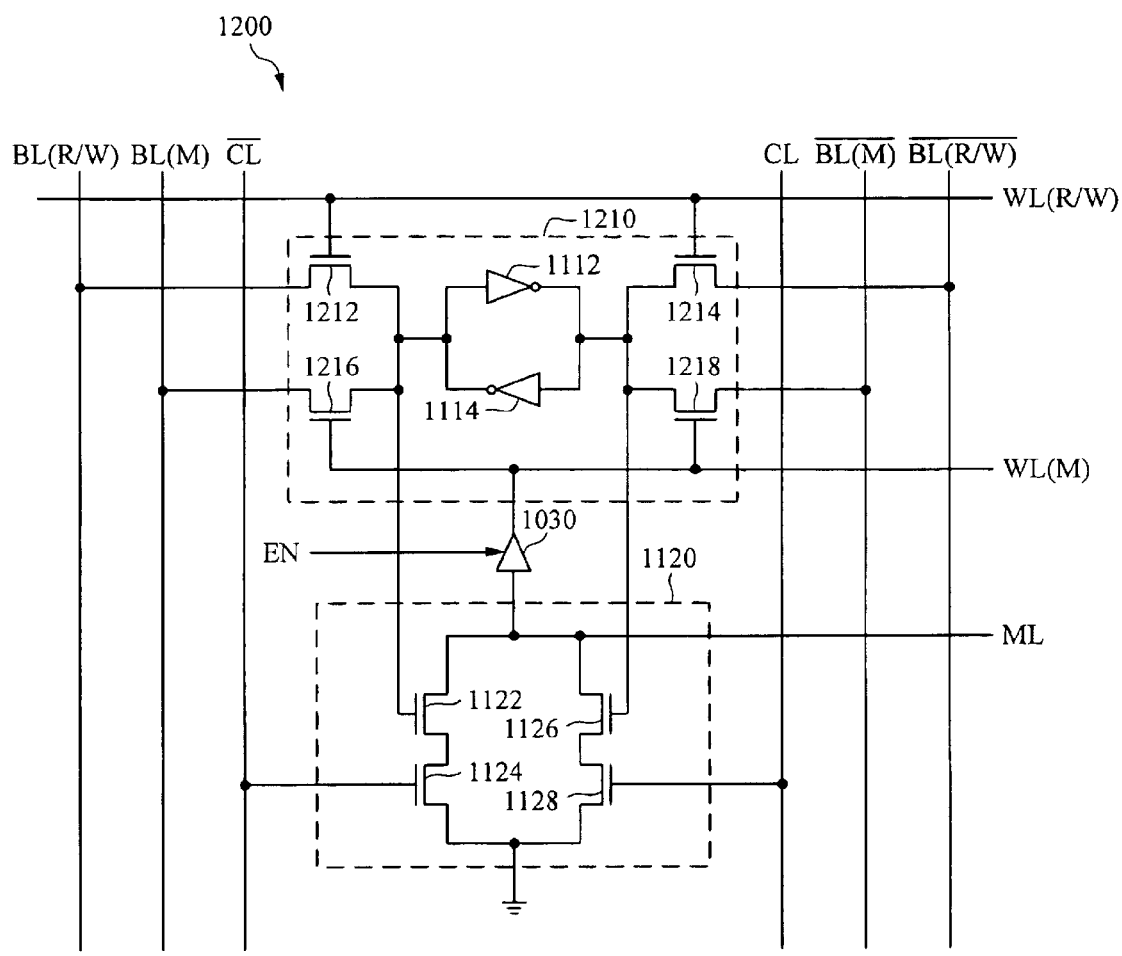
FIG. 12 is a circuit diagram of another embodiment of the CAM cell of FIG. 10.

FIG. 12 shows a CAM cell 1200 that is another embodiment of CAM cell 1000. CAM cell 1200 includes two word lines WL(M) and WL(R/W), and two bit line pairs BL(M) and $\overline{BL(M)}$ and BL(R/W) and $\overline{BL(R/W)}$. Word line WL(M) and bit line pair BL(M) and $\overline{BL(M)}$ are used for reading matching data from CAM cells during compare operations, and word line WL(R/W) and bit line pair BL(R/W) and $\overline{BL(R/W)}$ are used for read and write operations using addresses provided by address decoder 108.

CAM cell 1200 includes a modified memory cell 1210, as well as the compare circuit 1120 and driver circuit 1030 described above with respect to FIG. 11. Memory cell 1210 includes a RAM cell formed by cross-coupled inverters 1112 and 1114, and includes pass transistors 1212, 1214, 1216, and 1218. Pass transistor 1212 is coupled between the RAM cell and read/write bit line BL(R/W), and has a gate coupled to read/write word line WL(R/W). Pass transistor 1214 is coupled between the RAM cell and complementary read/write bit line $\overline{BL(R/W)}$, and has a gate coupled to read/write word line WL(R/W). Pass transistor 1216 is coupled between the RAM cell and match bit line BL(M), and has a gate coupled to match word line WL(M). Pass transistor 1218 is coupled between the RAM cell and complementary match bit line $\overline{BL(M)}$, and has a gate coupled to match word line WL(M).

The operation of CAM cell 1200 is as follows. For write operations, read/write word line WL(R/W) is asserted (e.g., to logic high) by address decoder 108, and data provided on read/write bit line pair BL(R/W) and $\overline{BL(R/W)}$ is written to the RAM cell via pass transistors 1212 and 1214, respectively. For read operations, read/write word line WL(R/W) is asserted (e.g., to logic high) by address decoder 108, and data is read from the RAM cell to read/write bit line pair BL(R/W) and $\overline{BL(R/W)}$ via pass transistors 1212 and 1214, respectively.

The operation of CAM cell 1200 for compare operations is similar to that of CAM cell 1100 of FIG. 11, where driver circuit 1030 drives match word line MWL to logic high during the evaluation phase (EN=1) of the compare operation if the match signal on match line ML indicates a match (ML=1), and does not drive match word line WML if there is not a match (ML=0). Data may be read from CAM cell 1200 if match word line MWL is driven to logic high in response to a match on match line ML.

For the embodiment shown in FIG. 12, CAM cell 1200 discharges ML to logic low if there is not a match, and does not discharge ML if there is a match. Thus, a logic high signal on match line ML indicates a match for the row, and a logic low signal on match line ML indicates a mismatch for the row. For other embodiments, CL and $\overline{CL}$ may be reversed (e.g., the gate of transistor 1124 is coupled to CL and the gate of transistor 112B is coupled to $\overline{CL}$) such that the CAM cell discharges ML to logic low if there is a match and does not discharge ML if there is not a match. For these other embodiments, driver circuit 1030 may be an inverting driver circuit.

Figure 13:
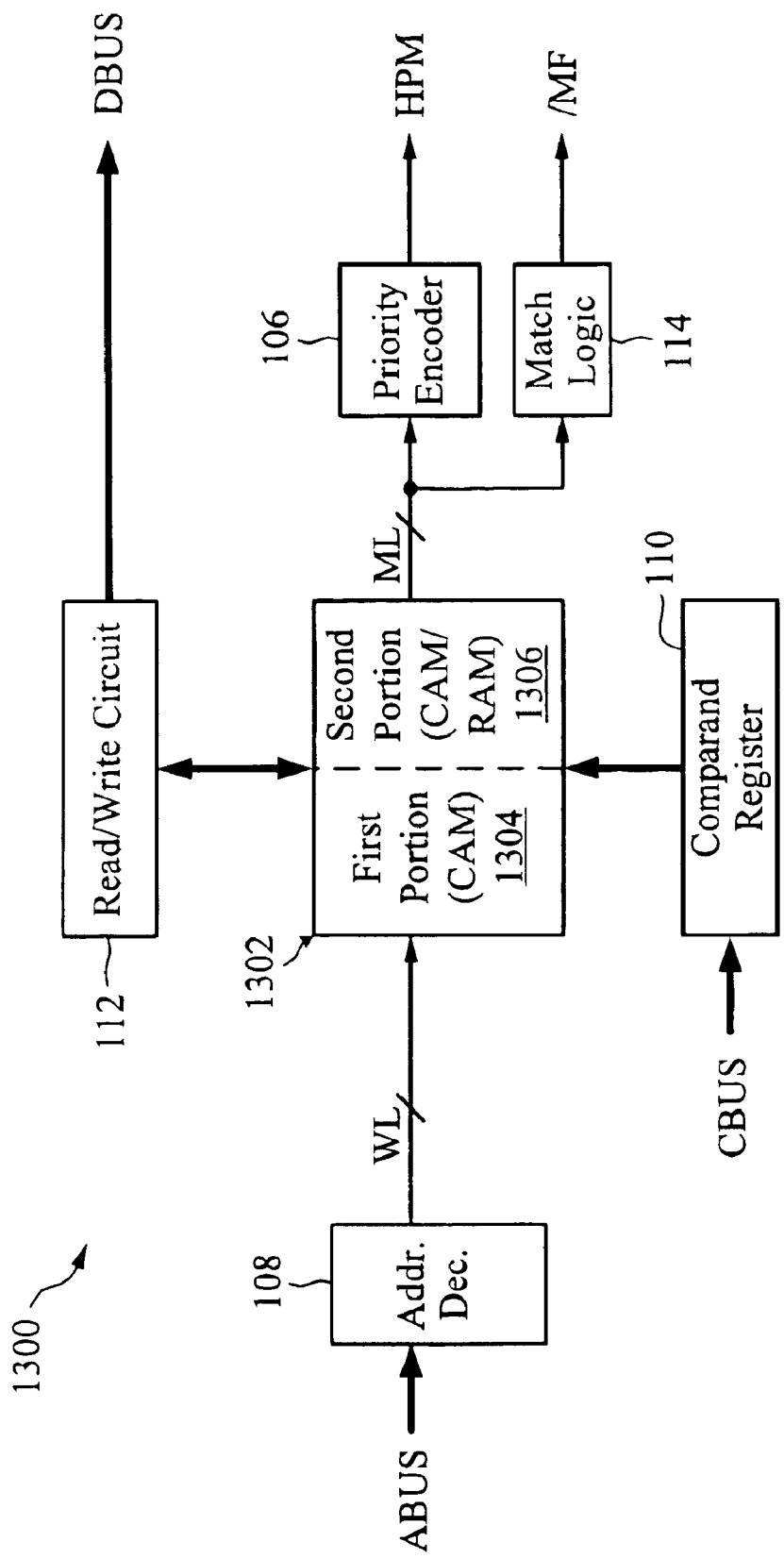
FIG. 13 is a block diagram of another embodiment of a CAM device in accordance with the present invention.

FIG. 13 shows a CAM device 1300 in accordance with another embodiment of the present invention. CAM device 1300 includes a CAM array 1302 that has a plurality of CAM cells (not shown in FIG. 13 for simplicity) arranged in any number of rows and columns. CAM array 1302 is segmented into first and second portions 1304 and 1306, respectively. First portion 1304 is a CAM portion that includes CAM cells that may be used for compare operations, and second portion 1306 is a CAM/RAM portion that includes auto-read CAM cells that may be used for compare operations or for storing associative data corresponding to CAM entries in first portion 1304. One or more instructions and related control signals may be provided to CAM device 1300 from an instruction decoder (not shown for simplicity) to control read, write, and compare operations for CAM device 1300. Other well-known signals which may be provided to CAM device 1300, such as enable signals, reset signals, and clock signals, are not shown for simplicity.

Each row of CAM cells in array 1302 is coupled to address decoder 108 via a corresponding word line WL, and to priority encoder 106 via a corresponding match line ML. For simplicity, the word lines WL and match lines ML are represented collectively in FIG. 13. The match lines ML provide match results for compare operations to match logic 114 and priority encoder 106. In response to the match signals on match lines ML, match logic 114 may assert match flag /MF to indicate the match condition, and priority encoder 106 may generate the index or address of the highest priority match (HPM).

Further, although not shown in FIG. 13 for simplicity, each row of CAM cells in CAM array 1302 may have one or more validity bits to indicate whether the corresponding row (or segment thereof) of CAM cells is in a valid state or an empty state. The validity bits may be provided to priority encoder 106 to generate the next free address (NFA) that is available in CAM array 102 for storing new data. The validity bits may also be provided to a well-known full flag logic circuit (not shown for simplicity) to generate a full flag for CAM array 1302.

Each column of CAM cells in array 1302 is coupled to comparand register 110 via comparand lines CL and to read/write circuit 112 via bit lines BL. Comparand register 110 provides comparand data to CAM array 1302 during compare operations. Read/write circuit 112 includes well-known write drivers and sense amplifiers, and is coupled to data bus DBUS. Although not shown for simplicity, CAM device 1300 may also include a global mask circuit that stores one or more mask patterns that mask entries in CAM array 1302 during compare operations with the comparand word provided by comparand register 110.

Figure 14:
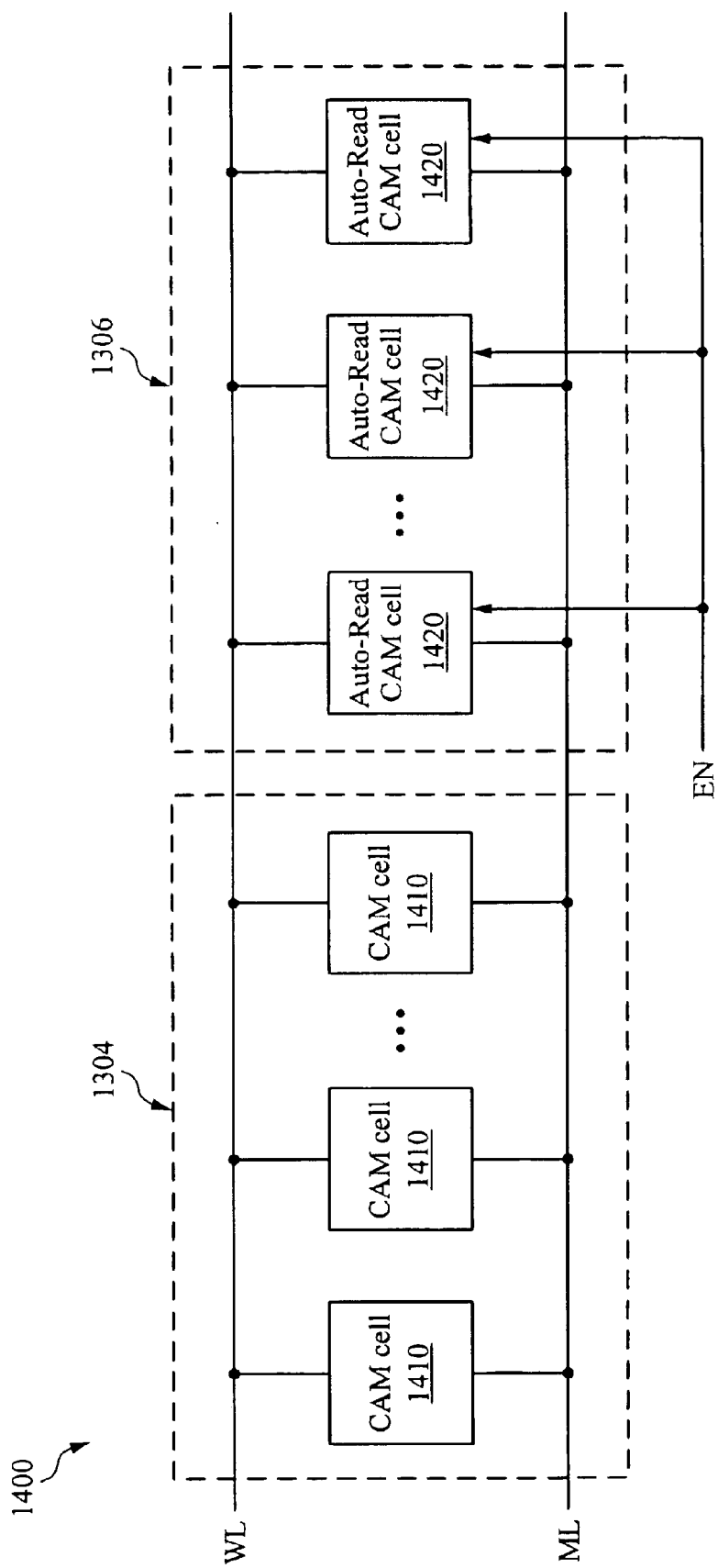
FIG. 14 is a block diagram of one embodiment of a row of the CAM device of FIG. 13.

FIG. 14 shows one embodiment of a row 1400 of CAM array 1300. First portion 1304 includes any number of CAM cells 1410 coupled to word line WL and match line ML. CAM cells 1410 may be any suitable type of CAM cell, including any binary, ternary, SRAM-based, or DRAM-based CAM cell for storing at least one bit one data. For one embodiment, each CAM cell 1410 in row 1400 is CAM cell 500 of FIG. 5, although other CAM cells may be used. Second portion 1306 includes any number of auto-read CAM cells 1420 coupled to word line WL and match line ML. Each auto-read CAM cell includes a driver circuit (not shown in FIG. 14) having an input coupled to match line ML, an output coupled to word line WL, and a control terminal coupled to receive EN. When enabled by EN, the driver circuit within each CAM cell 1420 of row 1400 may assert word line WL in response a match signal on match line ML during a compare operation, as described above with respect to FIGS. 10–12. For one embodiment, CAM cells 1420 are CAM cells 1100 of FIG. 11. For another embodiment, CAM cells 1420 are CAM cells 1200 of FIG. 12.

Operation of CAM device 1300 is described with respect to FIGS. 13 and 14. In a first mode of operation, CAM cells 1410 of first portion 1304 and CAM cells 1420 of second portion may both be used as CAM cells. EN is de-asserted to disable the driver circuits within CAM cells 1420 so data is not automatically read from CAM cells 1420 during compare operations. Comparand data provided to CAM array 1302 is compared with entries stored in both first portion 1304 and second portion 1306 of the CAM array. If row 1400 has a match, the match signal on match line ML is asserted. The asserted match signal is provided to match logic 114 and to priority encoder 106. In response thereto, match logic 114 asserts /MF to indicate the match condition, and priority encoder 106 generates the HPM address. The HPM address may be used to read associative data from another memory device such as, for example, an associated RAM device. If there is not a match, match logic 114 de-asserts /MF to indicate the mismatch condition.

In a second mode of operation, CAM cells 1410 of first portion 1304 may be used as CAM cells and auto-read CAM cells 1420 of second portion may be used as RAM cells to store associative data corresponding to CAM entries in first portion 1304. EN is asserted to enable the driver circuits within CAM cells 1420 so that associative data may be automatically read from CAM cells 1420 in response to a match during compare operations. Comparand data provided to CAM array 1302 is compared with entries stored in only first portion 1304 the CAM array. If CAM cells 1410 of first row portion 1304 have a match, the match signal on match line ML is asserted. The asserted match signal causes the driver circuits within auto-read CAM cells 1420 of second row portion 1306 to automatically read associative data stored therein to read/write circuit 112, which in turn outputs the associative data onto DBUS. Match logic 114 may assert /MF to indicate the match condition, and priority encoder 106 may generate the HPM for the compare operation. If there is not a match in first portion 1304, the match line ML is not asserted, and the associative data stored in auto-read CAM cells 1420 of second portion 1306 is not read. Match logic 114 may de-assert /MF to indicate the mismatch condition.

When CAM array 1302 operates in the second mode, e.g., in the CAM/RAM mode, associative data stored in CAM cells 1420 of second portion 1306 may be automatically read from CAM array 1302 in response to the comparison between comparand data and CAM entries stored in CAM cells 1410 of first portion 1304 without generating the HPM address, thereby improving performance. In addition, because associative data may be stored in second portion 1306 of CAM array 1302, a separate memory is not necessary for storing associative data, thereby saving valuable die area.

For other embodiments, match logic 114 may be coupled to data lines (e.g., bit line pairs or DBUS) of CAM array 1302 to detect the match condition, as described above with respect to FIG. 1.

What is claimed is:

1. A content addressable memory (CAM) cell, comprising:
    a memory cell coupled to a word line;
    a compare circuit coupled to the memory cell and to a match line; and
    a driver circuit having an input coupled to the match line and an output coupled to the word line.

2. The CAM cell of claim 1, wherein the driver circuit selectively asserts the word line in response to a match signal on the match line.

3. The CAM cell of claim 1, wherein the driver circuit drives the word line to read data from the CAM cell if the match line indicates a match condition.

4. The CAM cell of claim 1, wherein the driver circuit includes a control terminal to receive an enable signal.

5. The CAM cell of claim 4, wherein the enable signal is asserted to enable the driver circuit when a match signal on the match line is valid.

6. The CAM cell of claim 4, wherein the enable signal is de-asserted to disable the driver circuit when a match signal on the match line is not valid.

7. A content addressable memory (CAM) cell, comprising:
    means for selecting the cell;
    means for storing data;
    means for indicating a match condition during a compare operation; and
    means for reading matching data from the CAM cell during the compare operation in response to the match condition.

8. The CAM cell of claim 7, wherein the means for reading selects the CAM cell for reading the matching data without generating a match address.

9. The CAM cell of claim 8, wherein the means for reading comprises a driver circuit having an input coupled to the means for indicating and an output coupled to the means for selecting.

10. The CAM cell of claim 9, wherein the driver circuit further comprises:
    means to receive an enable signal.

11. A content addressable memory (CAM) device including an array organized in any number of rows and columns, each of the rows comprising:
    a plurality of CAM cells;
    a word line coupled to the CAM cells; and
    a match line coupled to the CAM cells, wherein each of the CAM cells includes a driver circuit having an input coupled to the match line and an output coupled to the word line.

12. The CAM device of claim 11, wherein each driver circuit further comprises a control terminal to receive an enable signal.

13. The CAM device of claim 11, wherein the driver circuit drives the word line in response to a match condition on the match line.

14. The CAM device of claim 11, further comprising:
    a plurality of bit lines, each coupled to the CAM cells in a corresponding column of the array; and
    match logic coupled to the bit lines.

15. The CAM device of claim 14, wherein the match logic monitors the bit lines for the matching data to detect a match condition.

16. The CAM device of claim 11, further comprising:
    a data bus coupled to the array; and
    match logic coupled to the data bus.

17. The CAM device of claim 16, wherein the match logic monitors the data bus for the matching data to detect a match condition.

18. A content addressable memory (CAM) device including an array organized in any number of rows and columns, each of the rows comprising:
    a plurality of CAM cells;
    a word line coupled to the CAM cells; and
    a match line coupled to the CAM cells, wherein each of the CAM cells includes means for driving the word line in response to a match signal on the match line.

19. The CAM device of claim 18, wherein the means for driving comprises a driver circuit having an input terminal coupled to the match line, an output terminal coupled to the word line, and a control terminal to receive an enable signal.

20. The CAM device of claim 18, wherein the means for driving causes data stored in a matching row of the array to be read from the array during a compare operation without providing an address to the array.

21. The CAM device of claim 18, further comprising:
    means for detecting the data read from the matching row of the array to indicate a match condition.

22. The CAM device of claim 21, wherein the means for detecting comprises match logic coupled to a plurality of bit lines of the array.

23. The CAM device of claim 21, wherein the means for detecting comprises match logic coupled to a data bus of the CAM device.

24. A method for operating a content addressable memory (CAM) device including an array having a plurality of rows of CAM cells, each row coupled to a match line and to a word line, comprising:
    comparing a comparand word with data stored in the rows of CAM cells;
    asserting the match line for a row that has matching data; and
    within each CAM cell in the row that has matching data, driving the word line to an asserted state to read the matching data from the row.

25. The method of claim 24, wherein each CAM cell includes a driver circuit to drive the word line in response to the asserted match line.

26. The method of claim 24, further comprising:
determining whether the matching data is read from the array; and
asserting a match flag in response to the determining.

27. The method of claim 26, wherein the determining comprises:
monitoring a plurality of bit lines of the array for the matching data.

28. The method of claim 26, wherein the determining comprises:
monitoring a data bus of the CAM device for the matching data.

29. A content addressable memory (CAM) device comprising:
an array of CAM cells organized in any number of rows and columns:
a plurality of word lines, each coupled to a corresponding row of the array;
a plurality of match lines, each coupled to a corresponding row of the array;
a number of data lines, each coupled to a corresponding column of the array; and
match logic coupled to the data lines.

30. The CAM device of claim 29, wherein the match logic asserts a match flag if data is detected on the data lines during a compare operation.

31. The CAM device of claim 29, wherein the data lines comprise bit lines.

32. The CAM device of claim 29, wherein the data lines comprise a data bus.

33. The CAM device of claim 29, wherein the match logic comprises:
an AND gate having a plurality of inputs, each coupled to a corresponding data line, and an output to provide a match flag.

34. The CAM device of claim 29, wherein the match logic comprises:
a comparator having a plurality of first inputs, each coupled to a corresponding data line, a plurality of second inputs to receive a comparand word, and an output to provide a match flag.

35. An array of content addressable memory (CAM) cells having any number of rows, each of the rows comprising:
a first portion having a plurality of first CAM cells coupled to a match line and a word line; and
a second portion having a plurality of second CAM cells coupled to the match line and the word line, wherein each of the second CAM cells comprises:
a memory cell coupled to the word line;
a compare circuit coupled to the memory cell and to the match line; and
a driver circuit having an input coupled to the match line and an output coupled to the word line.

36. The array of claim 35, wherein the driver circuit asserts the word line in response to a match signal on the match line.

37. The array of claim 35, wherein the driver circuit include a control terminal to receive an enable signal.

38. The array of claim 35, wherein the second CAM cells participate with the first CAM cells in compare operations when the enable signal is de-asserted to disable the driver circuits.

39. The array of claim 35, wherein the second CAM cells store associative data that may be automatically read in response to compare operations for the first CAM cells when the enable signal is asserted to enable the driver circuits.

* * * * *